United States Patent
O'Keefe et al.

(10) Patent No.: US 7,538,365 B2
(45) Date of Patent: May 26, 2009

(54) FIELD EFFECT TRANSISTOR WITH ALUMINUM AND PHOSPHORUS ETCH STOP LAYER

(75) Inventors: Matthew Francis O'Keefe, Aycliffe Village (GB); Michael Charles Clausen, Heighington Village (GB); Richard Alun Davies, Northampton (GB); Robert Grey, Newton Aycliffe (GB)

(73) Assignee: Filtronic PLC, West Yorkshire (GB)

( * ) Notice: Subject to any disclaimer, the term of this patent is extended or adjusted under 35 U.S.C. 154(b) by 278 days.

(21) Appl. No.: 11/153,785

(22) Filed: Jun. 15, 2005

(65) Prior Publication Data

US 2005/0285144 A1    Dec. 29, 2005

(30) Foreign Application Priority Data

Jun. 15, 2004    (GB) ................................ 0413277.5

(51) Int. Cl.
*H01L 31/00*    (2006.01)
*H01L 29/739*    (2006.01)
(52) U.S. Cl. ................. 257/194; 257/192; 257/E29.246
(58) Field of Classification Search ................. 257/192, 257/194, E29.246

See application file for complete search history.

(56) References Cited

U.S. PATENT DOCUMENTS

| 5,610,410 | A | 3/1997 | Imanishi |
| 6,242,293 | B1 | 6/2001 | Danzilio |
| 6,800,878 | B2 * | 10/2004 | Nambu et al. ............... 257/194 |

FOREIGN PATENT DOCUMENTS

| EP | 0 551 110 A3 | 7/1993 |
| JP | 8 340012 A | 12/1996 |
| WO | WO 2005/055322 A | 6/2005 |

OTHER PUBLICATIONS

Search Report under Section 17, Application No. GB0512196.7, Date of Search: Oct. 13, 2005, Great Britain, one page.

* cited by examiner

*Primary Examiner*—Ngan Ngo
(74) *Attorney, Agent, or Firm*—Howard & Howard Attorneys PLLC

(57) ABSTRACT

A III-V field effect transistor includes a semiconductor channel layer having an electrically conducting channel and an ohmic contact layer on the semiconductor channel layer. The ohmic contact layer has a recess structure disposed therethrough to the semiconductor channel layer. The bottom of the ohmic contact layer includes an etch stop layer including Aluminum and Phosphorous and defining the shape of the recess at its junction with the semiconductor channel layer.

31 Claims, 7 Drawing Sheets

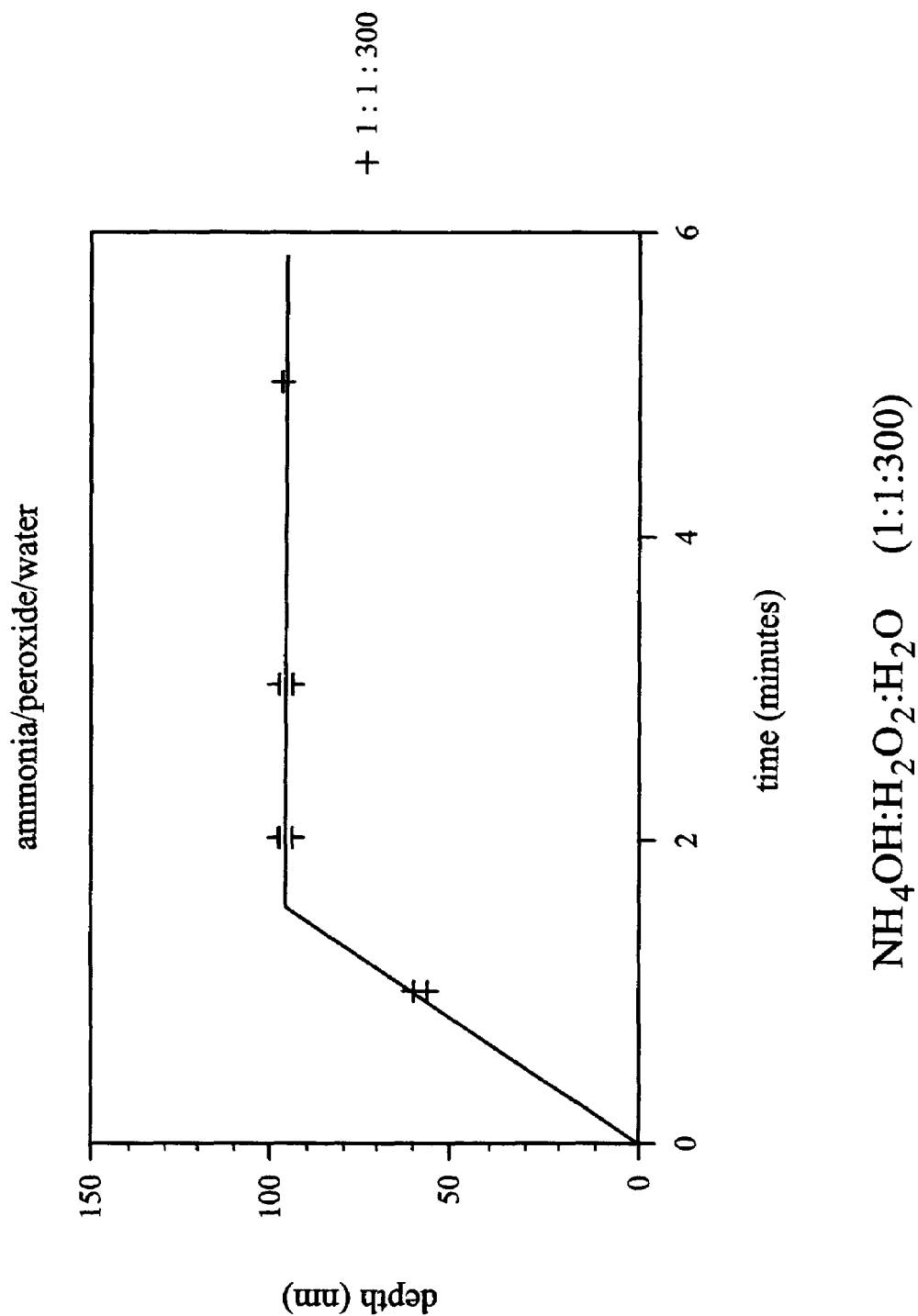

FIELD EFFECT TRANSISTOR WITH ALUMINUM AND PHOSPHORUS ETCH STOP LAYER

The present invention relates to a III-V field effect transistor (FET) in which a recess is formed using an etch stop layer. The present invention also relates to a compound semiconductor substrate including an etch stop layer in which the FET can be formed, and a method of forming the recess.

The field effect transistor, in particular the high electron mobility transistor (HEMT) and pseudomorphic high electron mobility transistor (pHEMT) can achieve fast switching times and are particularly suited for modern telecommunications apparatus. FETs have three electrical connections, a gate, a source and a drain. The structure conventionally comprises a semiconductor channel layer having an electrically conducting channel and a ohmic contact layer thereon. A recess is etched through the ohmic contact layer to the semiconductor channel layer. The electrically conducting channel is typically (although not always) separated from the bottom of the recess by a Schottky layer. The drain and source are formed on opposite sides of the recess on the ohmic contact layer. The gate is formed in the recess in contact with the semiconductor channel layer. The electrically conducting channel is modulated by the gate.

It can therefore be seen that the recess formed within the ohmic contact layer is a vital part of the FET structure. Various techniques for forming this recess have been proposed. For example, U.S. Pat. No. 6,242,293 B1 (Danzilio) discusses a pHEMT structure in which one or more etch stop layers is used to define the depth of the recess. The etch stop layer is present within the compound semiconductor structure. When the recess is etched using lithography techniques, the chemistry of the etchant is chosen so that it does not etch the etch stop layer. This allows precise control of the depth of the recess. The method described in Danzilio uses layers of InGaP to function as etch stop layers. This is an effective etch stop for a wet etch chemistry, but not for a dry etch chemistry.

The choice of etch chemistry depends on the width of the recess required. A dry etch chemistry has little tendency to etch underneath the edges of the resist. This results in a recess which conforms strongly to the dimensions of the resist. Conversely, a wet etch chemistry tends to etch underneath the resist. Thus in a wet etch process, the width of the recess will be larger than the width of the gap in the resist.

The choice of chemistry will depend on the precise characteristics of the individual transistor. In the Danzilio patent, it is only possible to use wet etch chemistry. There is no option of using dry etch chemistry without producing a different compound semiconductor substrate with a different etch stop layer.

U.S. Pat. No. 5,610,410 (Imanishi) proposes including a layer of InAlP on top of a transition layer of AlGaAs. The gate is then formed on top of the InAlP layer. The use of this layer increases the Schottky barrier level and allows use at higher gate voltages.

The present invention provides a FET including an etch stop layer which comprises both Aluminium and Phosphorous. The presence of Aluninium allows a dry etch chemistry to be effective and the presence of Phosphorous allows a wet etch chemistry to be effective. Therefore, the FET can be created using either a wet etch or a dry etch chemistry depending on the precise device characteristics required.

Accordingly, in a first aspect the present invention provides a III-V field effect transistor comprising a semiconductor channel layer having an electrically conducting channel;

an ohmic contact layer on the semiconductor channel layer, the ohmic contact layer having a recess structure disposed therethrough to the semiconductor channel layer; the bottom of the ohmic contact layer comprising an etch stop layer comprising Aluminium and Phosphorous and defining the shape of the recess at its junction with the semiconductor channel layer.

The recess structure extends entirely through the etch stop layer to the semiconductor channel layer, unlike the device disclosed in Imanishi. The presence of the etch stop layer comprising Aluminium and Phosphorous allows a choice of wet etch chemistry or dry etch chemistry to be used depending on the transistor characteristics required. This allows a wide choice of fabrication techniques, with only the actual chemistry itself required to be altered. In previous methods and devices, the structure of the etch stop layer had to be chosen depending on whether a wet etch chemistry or a dry etch chemistry was to be used in manufacture. This construction overcomes this difficulty by allowing the use of a wet etch or a dry etch chemistry depending on the precise result required.

Preferably, the recess has a stepped profile and the ohmic contact layer comprises a plurality of etch stop layers comprising Aluminium and Phosphorus, the bottom etch stop layer defining the shape of the recess at its junction with the semiconductor channel layer.

Preferably, the etch stop layer comprises Indium Aluminium Phosphide.

Alternatively, the etch stop layer comprises Aluminium Gallium Phosphide.

Preferably, the III-V field effect transistor can further comprise a substrate supporting the semiconductor layer.

The substrate can be GaAs.

The III-V field effect transistor further comprises a buffer layer between substrate and semiconductor channel layer.

The buffer layer can be AlGaAs.

The buffer layer can be a lattice matching layer for matching the substrate lattice to the lattice of the semiconductor channel layer.

The electrically conducting channel can be the top layer of the semiconductor channel layer.

The III-V field effect transistor can be a MESFET.

The semiconductor layer can comprise a Schottky layer separating the electrically conducting channel from the bottom of the recess.

Preferably, the III-V field effect transistor further comprises an electron supply layer proximate to the electrically conducting channel.

The electron supply layer can be one of an n-AlGaAs layer or layer of silicon atoms.

A III-V field effect transistor can further comprise a spacer layer spacing the electron supply layer from the semiconductor channel layer, the spacer layer preferably being AlGaAs.

The semiconductor layer can be GaAs.

The transistor can be a HEMT.

The electrically conducting channel can comprises an InGaAs channel layer containing a 2DEG electron gas.

The InGaAs channel layer can be sandwiched between AlGaAs spacer layers.

The III-V field effect transistor can further comprise at least one electron supply layer on the opposite side of the spacer layer to the electrically conducting channel.

The electron supply layer can be a layer of silicon atoms.

The Schottky layer can be AlGaAs.

The transistor can be a pHEMT.

The ohmic contact layer can be GaAs.

The electrically conducting channel can comprise InGaAs.

The InGaAs layer can be sandwiched between InAlAs spacer layers

Preferably, the III-V field effect transistor further comprises at least one electron supply layer on the opposite side of the spacer layer to the electrically conducting channel.

The electron supply layer can be a layer of silicon atoms.

The Schottky layer can be InAlAs.

A III-V field effect transistor as claimed in any one of claims 25 to 29, wherein the ohmic contact layer is InAlAs.

The transistor can be a mHEMT.

In a further aspect of the invention there is provided a compound semiconductor substrate for processing to produce a field effect transistor, the substrate comprising a semiconductor channel layer having an electrically conducting channel and an ohmic-contact layer on the semiconductor channel layer the substrate further comprising an etch stop layer sandwiched between the ohmic contact layer and semiconductor channel layer, the etch stop layer comprising Aluminium and Phosphorous.

The etch stop layer can be Indium Aluminium Phosphide.

The etch stop layer can be Aluminium Gallium Phosphide.

A compound semiconductor substrate can comprise a plurality of etch stop layers with the ohmic contact layer.

Each of the plurality of etch stop layers can comprise Aluminium and Phosphorous.

In a further aspect of the invention there is provided a process for forming a recess in a semiconductor substrate as claimed in any one of claims 32 to 36 comprising the steps of covering part of the ohmic contact layer in a masking material;

forming at least one recess in the ohmic contact layer by etching the area not covered in the masking material, where the depth of the recess is determined by the at least one etch stop layer; and further etching through the etch stop layer;

wherein the etching of the recess is carried out with either a dry etch chemistry or wet etch chemistry.

The etching of the recess can be carried out with a dry etch chemistry.

The dry etch chemistry can comprise a mixture of fluorine and chlorine.

The etching of the recess can be carried out with a wet etch chemistry.

The wet etch chemistry can comprise a mixture of hydrogen peroxide and a dilute acid or base.

Alternatively, the wet etch chemistry can comprise a mixture of hydrogen peroxide and dilute sulphuric acid.

Alternatively, the wet etch chemistry can comprise a mixture of hydrogen peroxide and dilute hydrofluoric acid.

Alternatively, the wet etch chemistry can comprise hydrogen peroxide and dilute ammonia.

The masking material can be a resist, preferably a photoresist.

The present invention will now be described by way of example only and not in any limitative sense with reference to the accompanying drawings, in which FIG. 1 shows a cross section through a pHEMT structure according to the invention;

Figure 1:
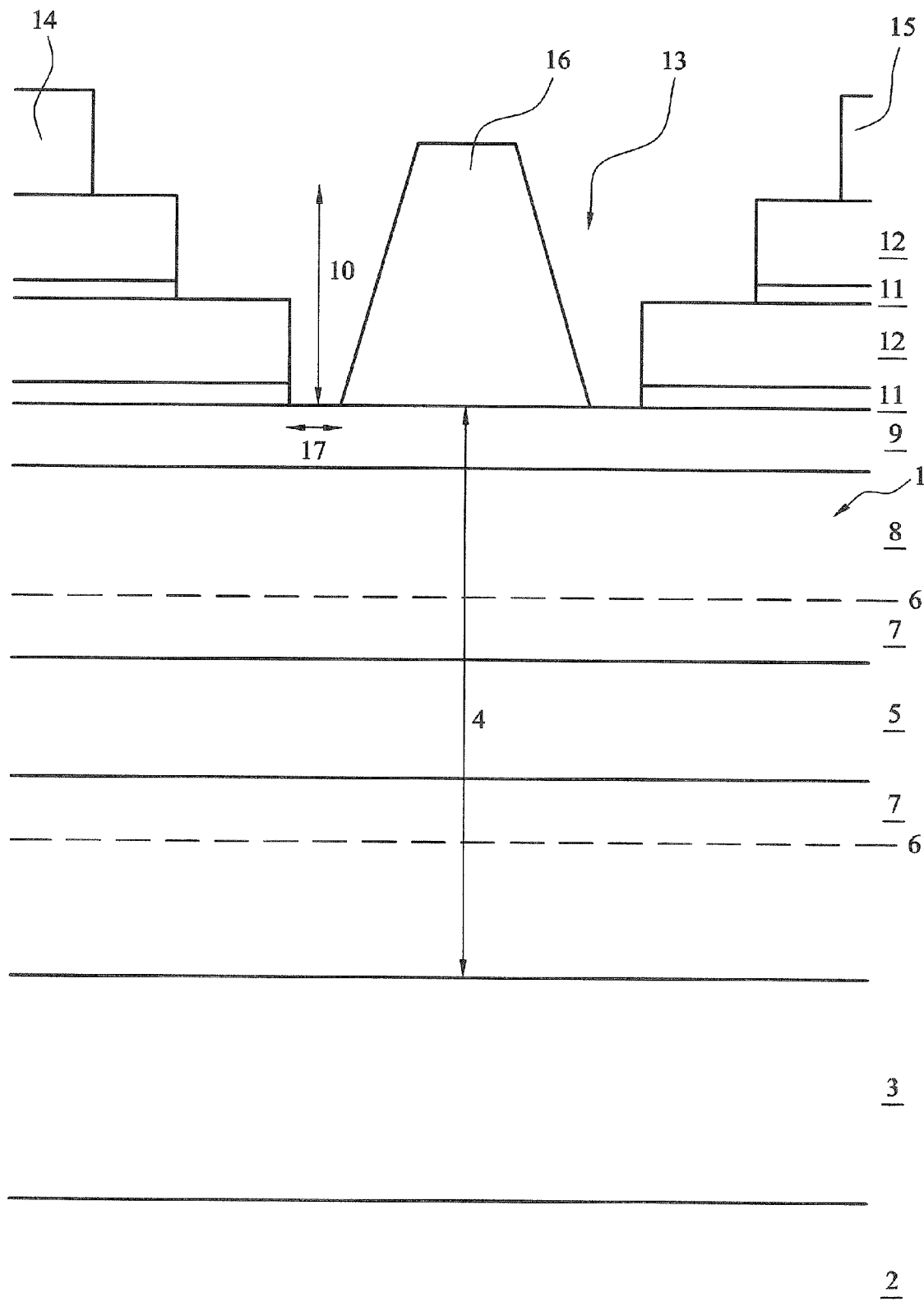

Shown in FIG. 1 is a cross section through a III-V field effect transistor 1 according to the invention. The transistor 1 is a GaAs pHEMT comprising a GaAs substrate 2. On the GaAs substrate is a AlGaAs buffer layer 3. On top of the buffer layer is a semiconductor channel layer 4. The semiconductor channel layer 4 comprises an InGaAs electrically conducting channel 5. On each side of the electrically conducting channel is a supply layer of silicon atoms 6. The silicon atoms 6 are spaced from the electrically conducting channel 5 by AlGaAs spacer layers 7. The supply layer of silicon atoms 6 supplies electrons to the electrically conducting channel 5 forming a high mobility two dimensional electron gas (2DEG). On top of the top Si supply layer is an AlGaAs Schottky layer 8 and forming the upper surface of the semiconductor channel layer is a GaAs coating 9.

Formed on the semiconductor channel layer 4 is an ohmic contact layer 10. The ohmic contact layer 10 comprises a plurality of etch stop layers of InAlP 11 separated by layers of GaAs 12. The top layer of the ohmic contact layer is a GaAs layer 12. The bottom layer in contact with the semiconductor etched layer is InAlP.

A stepped recess 13 is formed in the ohmic contact layer 10. The recess 13 extends through the bottom etch stop layer 11 to the semiconductor channel layer 4. The depth of the steps are determined by the position of the etch stop layers 11 within the ohmic contact layer 10.

A source 14 and a drain 15 are connected to opposite sides of the recess 13. A gate 16 is connected to the semiconductor channel layer 4 at the bottom of the recess 13.

The width of the recess 13, for example the distance between the edge of the first step and the edge of the gate 16 shown by arrow 17 on FIG. 1, is determined according to the chemistry used during the manufacture of the recess 13. A greater width is possible using wet etch techniques and a narrower width is possible using dry etch techniques. The choice of etch technique will depend on the particular transistor characteristics desired. This choice of etch chemistry is possible because the layers of InAlP 11 will act as an etch stop for both wet and dry etch chemistry. The etch chemistries used in this embodiment will be described in more detail later.

The embodiment of FIG. 1 includes twin silicon supply layers 6, one on either side of the electrically conducting channel 5. In an alternative embodiment there is only one silicon supply layer. This reduces the electron density of the 2DEG. In a further alternative embodiment the silicon supply layer 6 is replaced with a bulk doping layer.

Figure 2:
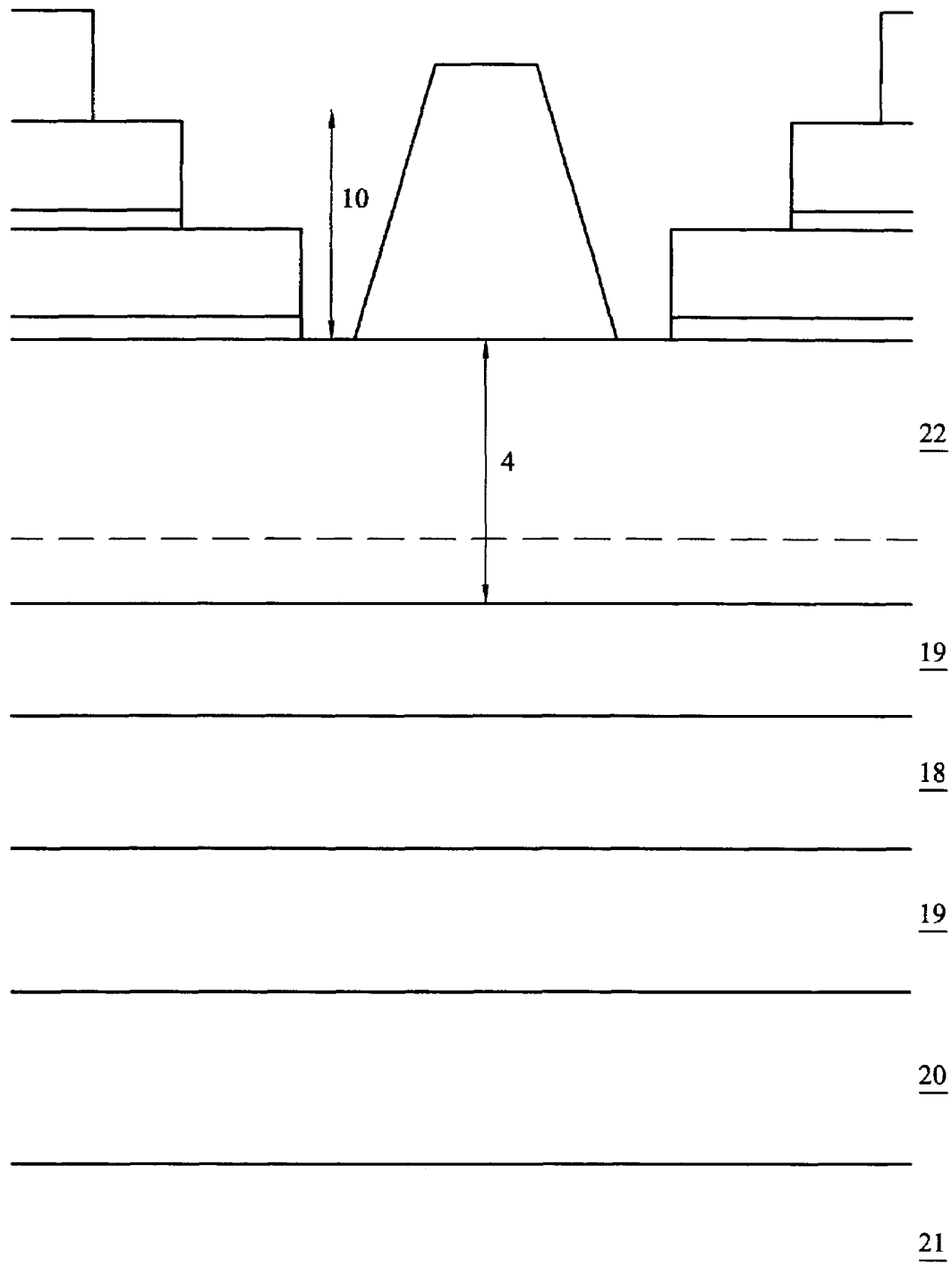
FIG. 2 shows a cross section through a HEMT structure according to the invention.

Shown in FIG. 2 is a further embodiment of a III-V field effect transistor according to the invention. The III-V FET is a GaAs HEMT. The GaAs HEMT comprises an n-AlGaAs supply layer 18 sandwiched between AlGaAs spacer layers 19. The bottom spacer layer 19 is deposited on a GaAs buffer layer 20 which is in turn deposited on a GaAs substrate 21.

A GaAs semiconductor channel layer 4 is deposited on top of the top spacer layer 19. The semiconductor channel layer 4 comprises a 2DEG separated from the top of the layer by a Schottky layer 22.

Deposited on top of the semiconductor channel layer is a ohmic contact layer 10. The ohmic contact layer 10 is identical to that of the pHEMT and will not be described in detail.

Figure 3:
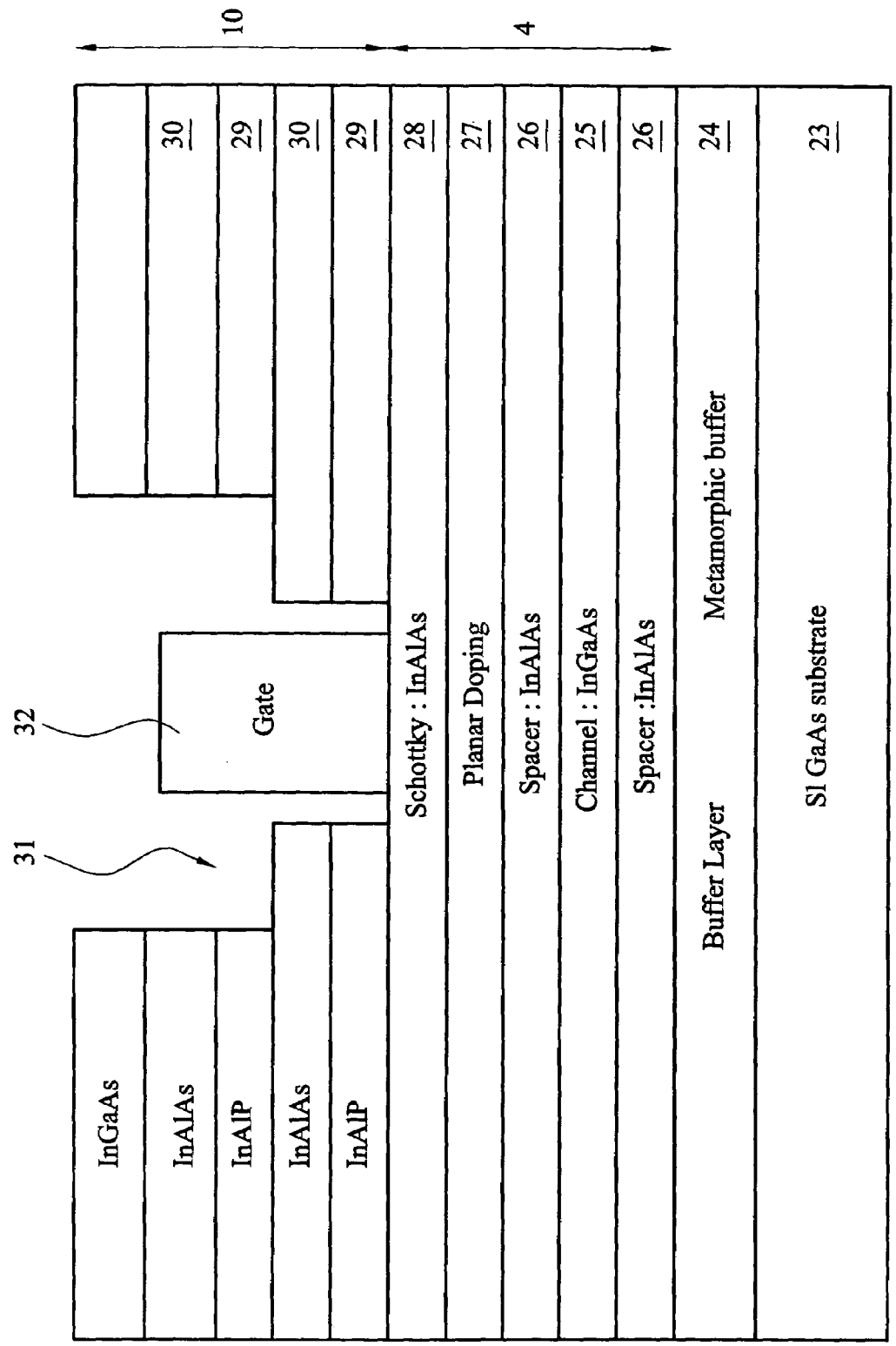
FIG. 3 shows a cross section through a mHEMT structure according to the invention.

Shown in FIG. 3 is a further embodiment of a III-V transistor according to the invention. The transistor comprises a mHEMT comprising a GaAs substrate 23. Deposited on the substrate 23 is a metamorphic buffer 24 and a semiconductor channel layer 4. The metamorphic buffer 24 allows for the lattice mismatch between the substrate 23 and the semiconductor channel layer 4.

The semiconductor channel layer 4 comprises an InAlAs electrically conducting channel 25 sandwiched between InAlAs spacer layers 26. On the top spacer layer 26 is a planar doped Si layer 27 acting as an electron source providing the 2DEG for the electrically conducting channel 25. This is in turn separated from the bottom of the recess by the Schottky layer 28.

On top of the semiconductor channel layer is the ohmic contact layer 10. The ohmic contact layer 10 comprises a plurality of InAlP etch stop layers 29, separated by InAlAs layers 30. The bottom layer of the ohmic contact layer 10 is InAlP.

The source and drain (not shown) are connected on opposite sides of the recess 31 on the ohmic contact layer 4. The gate 32 is formed within the recess.

Figure 4:
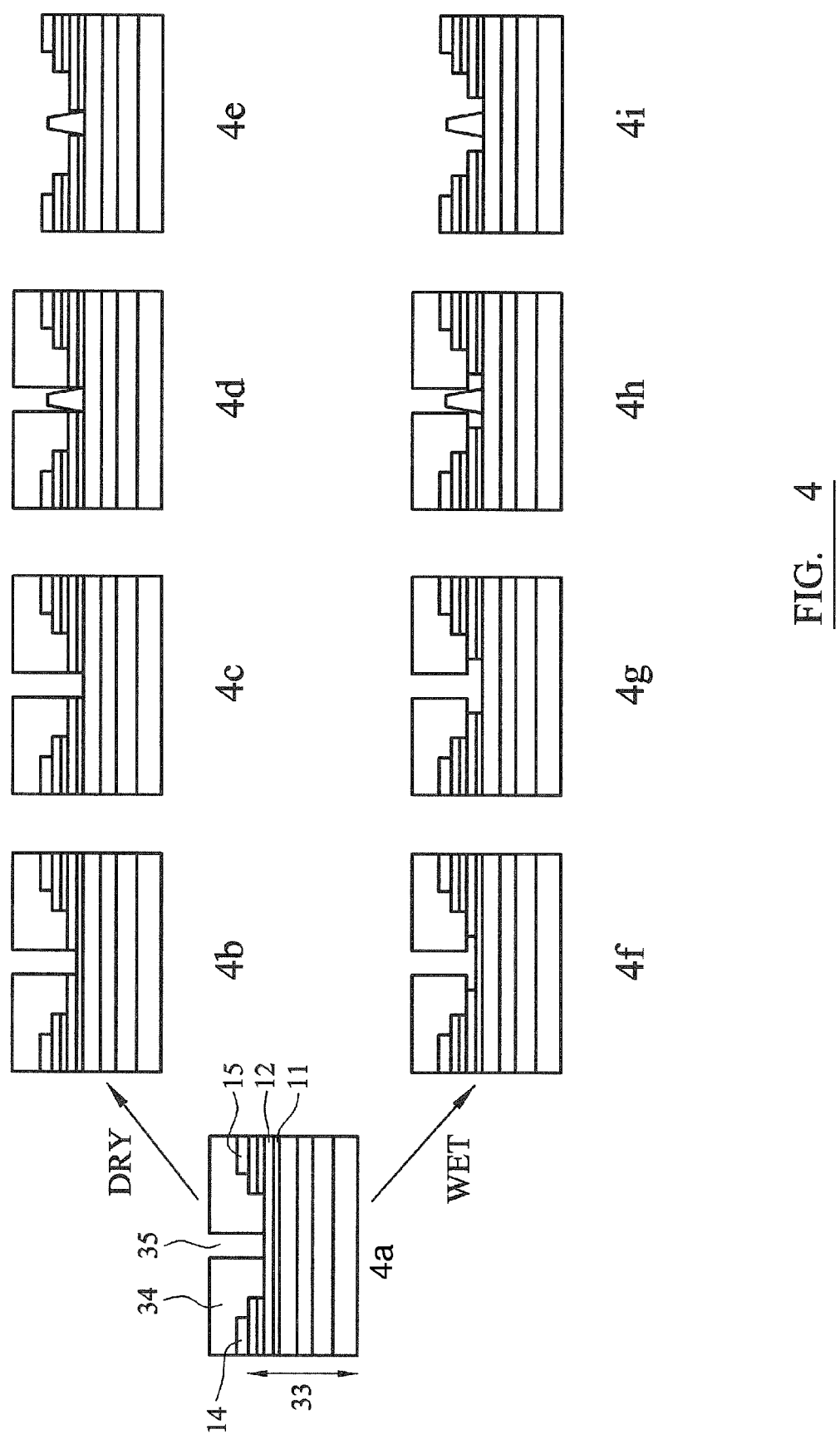
FIGS. 4a to 4i show a method of forming a recess according to an embodiment of the invention.

FIG. 4a illustrates a substrate 33 on which the source and drain contacts 14, 15 have already been deposited and the first step of the recess etched. A layer of resist 34 is present on top of the substrate 33 and a gap 35 has been formed to etch a further recess by removing the resist. The general process for both wet and dry etching is similar, apart from the chemistry used to etch. The dry and wet etch chemistry will be discussed in detail later.

In a first processing stage, the substrate is exposed to the etchant. This etches through the exposed GaAs ohmic contact layer 12 until the lower etch stop layer 11 is reached. However, at this point the difference between the wet and the dry etch chemistry becomes apparent. A wet etch chemistry will increase the width of the recess by etching away material which is present under the resist 34 and adjacent to the gap 35 in the resist 34. On the other hand, a dry etch etches very little material from under the resist 34. The etchant is applied for a specified time and then removed. The resulting structure is shown in FIG. 4b for a dry etch. It can be seen that the GaAs layer 12 has been etched in line with the gap 35 in the resist 34. However, with a wet etch chemistry, as shown in FIG. 4f, the GaAs layer 12 has also been etched under the resist 34, resulting in a wider recess 35.

A further etchant is then applied to remove the InAlP etch stop layer 11. This exposes the semiconductor channel layer 4. For a dry etch, this stage of the process is illustrated in FIG. 4c, and FIG. 4g for a wet etch.

Next, the gate electrode 16 is formed. It can be seen in FIG. 4d that there is very little space between the edge of the recess 35 and the edge of the gate electrode 16 for a dry etch process. However, for a wet etch process, because the GaAs layer 12 has been removed under the edges of the resist 34, there is a larger distance between the edges of the recess 35 and the gate 16.

In a final step, the resist 34 is removed leaving the completed pHEMT structure according to the first embodiment of the invention.

The wet etch chemistry will now be described in detail. A solution of Sulphuric acid ($H_2SO_4$)/hydrogen peroxide ($H_2O_2$)/DI water ($H_2O$) is used in this embodiment in a ratio of 1:9:700, respectively. Typical volumes of each constituent are 25 ml: 210 ml: 17500 ml. At 20° C. this produces an etch rate of approximately 8 Å per second. Selectivity of this chemistry was calculated at 40:1.

For a dry etching technique, there are two steps to the etch. A first step, known as the breakthrough step, ignites the plasma and removes any native oxide from the GaAs surface. This is followed by a main etch step. Table 1 below shows the chemicals and physical quantities for each of these etch steps:

TABLE 1

| | Dry Etch Chemistry | |
|---|---|---|
| | BREAKTHROUGH STEP | MAIN ETCH |
| $BCl_3$ | 7.5 | 7.5 |
| $SF_6$ | 1 | 3 |
| $N_2$ | 2 | 4 |
| He | 3 | 6 |
| Pressure (Atm) | 5 | 3 |
| Inductively Coupled Plasma Power (W) | 300 | 300 |
| RF Power (W) | 25 | 5 |
| Time (s) | 3 | Timed |

In the breakthrough step, the timing is kept low to reduce the amount of GaAs removed. Removal of GaAs is also reduced by keeping the ICP power, RF power and pressure to a minimum. If significantly lower values than those specified in Table 1 were used, the plasma ignition would become unstable.

In the main etching step a ratio of $BCl_3$ to $SF_6$ of 2.5:1 is used. Process flows of 7.5:3 standard cubic centimetres (SCCM) were chosen to ensure that selectivity requirements were met.

Figure 6:
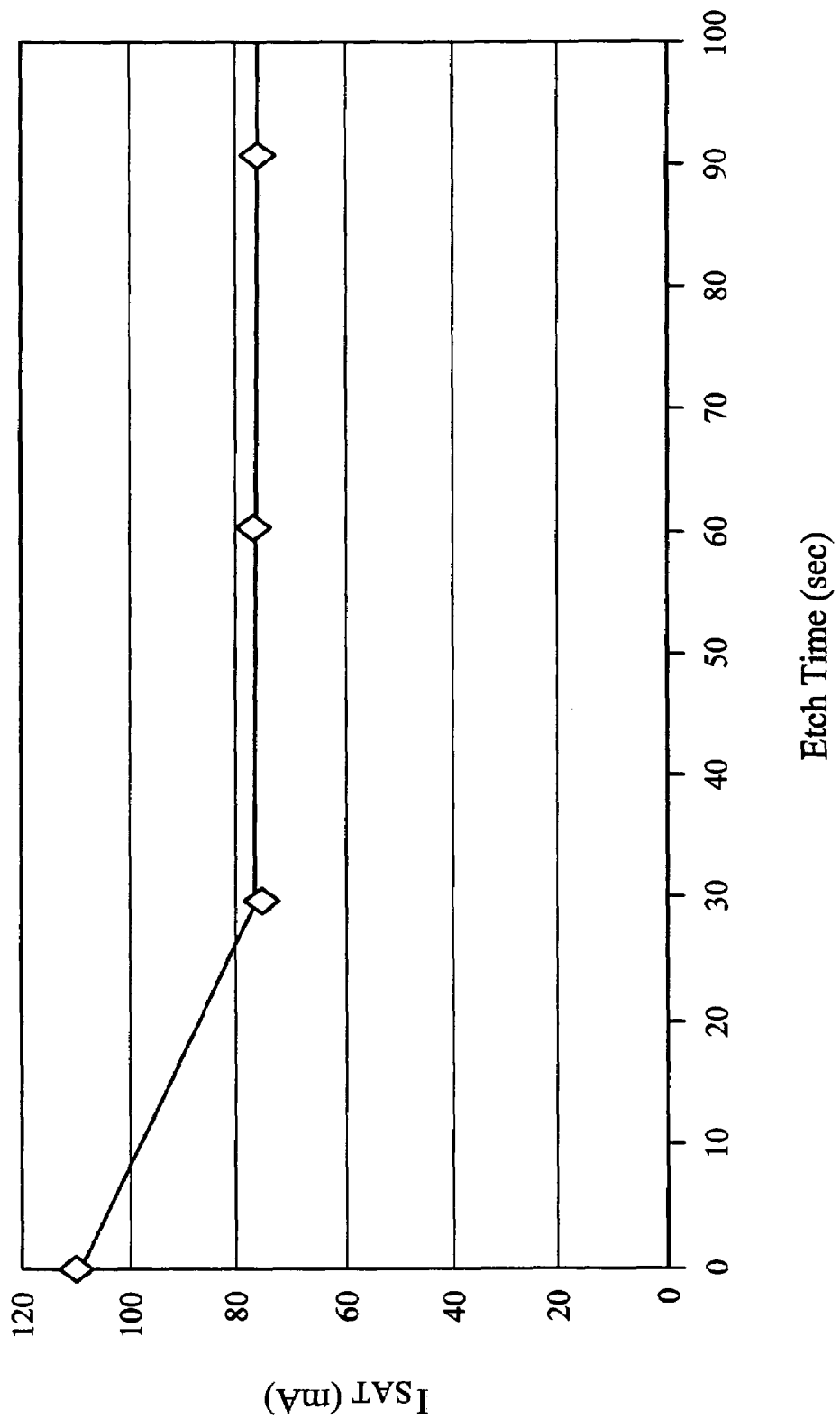
FIG. 6 illustrates the saturated current of a transistor against the etch time for a dry etch chemistry; and, FIG. 7 illustrates the etch depth against time for a further wet etch chemistry.

The results of the dry etch are shown in FIG. 6. The effect of the saturation current of the transistor ($I_{SAT}$) are shown versus the etched time. It can be seen that a plateau is reached where $I_{SAT}$ remains constant at just under 80 mA, and this illustrates the effect of the etch stop layer.

In an alternative embodiment, other chemistries for wet etching were used. These included using orthophosphoric ($H_3PO_4$) or hydrofluoric acid (HF) in place of the sulphuric acid.

Figure 5:
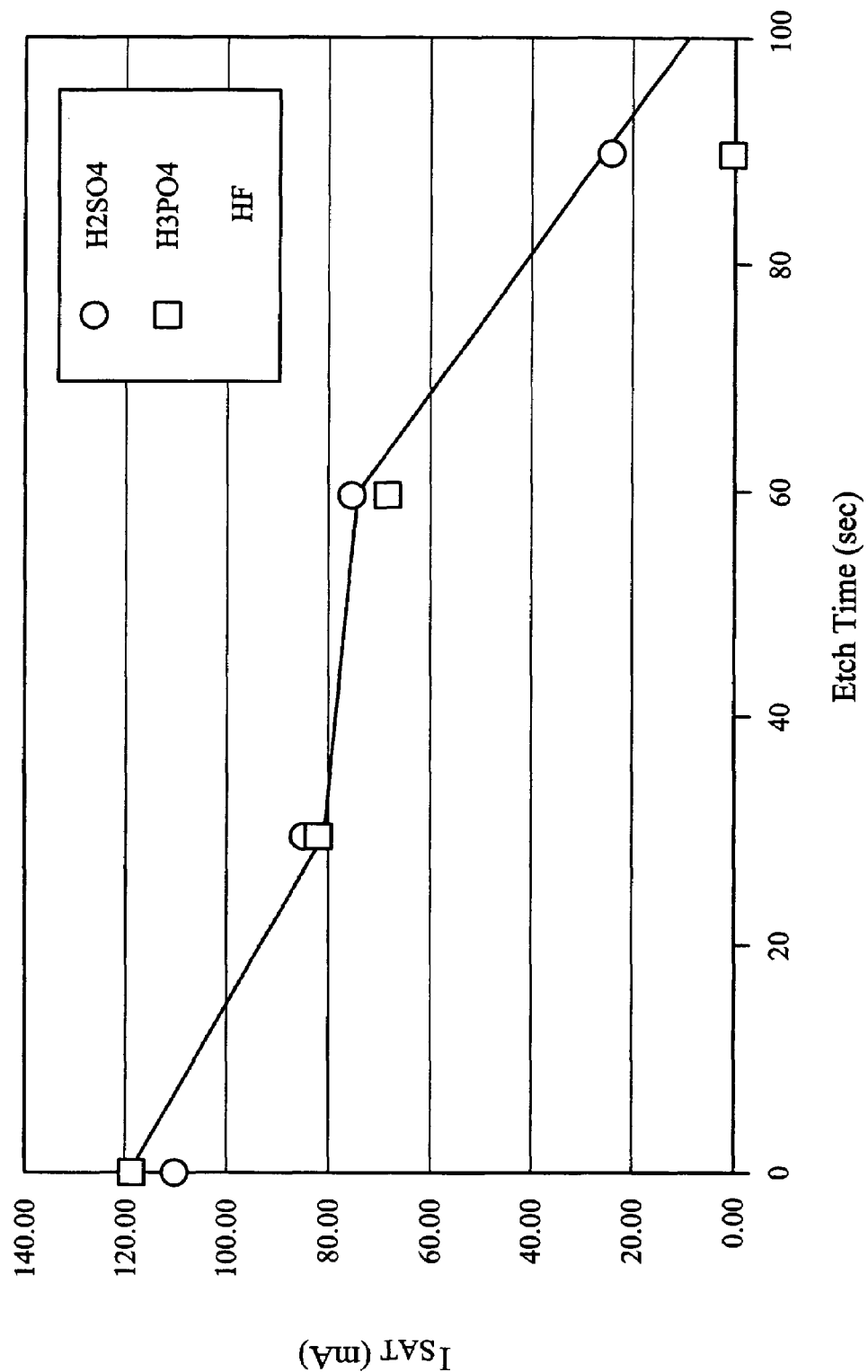
FIG. 5 illustrates the saturated current of a transistor according to the invention against etch time for different wet etch chemistries.

The results are illustrated in FIG. 5 which is a graph of the saturated current versus etch time. It can be seen that the best results are achieved with sulphuric acid. For sulphuric acid, the presence of a plateau where the etch stop layer is effective can be clearly seen.

In a further embodiment of the invention a further wet etch chemistry is used. In this embodiment the etch is $NH_4OH$:$H_2O_2$:$H_2O$ in approximately the ratio (1:1:300) Shown in FIG. 7 is a graph of etch depth against time showing the high selectivity of the etch.

The invention claimed is:
1. A III-V field effect transistor comprising:
   a semiconductor channel layer having an electrically conducting channel;
   an ohmic contact layer on the semiconductor channel layer, the ohmic contact layer having a recess structure disposed therethrough to the semiconductor channel layer;
   the bottom of the ohmic contact layer comprising an etch stop layer comprising Aluminum and Phosphorous and defining the shape of the recess at its junction with the semiconductor channel layer.
2. A III-V field effect transistor as claimed in claim 1, wherein the recess has a stepped profile and the ohmic contact layer comprises a plurality of etch stop layers comprising Aluminum and Phosphorus, the bottom etch stop layer defining the shape of the recess at its junction with the semiconductor channel layer.

3. A III-V field effect transistor as claimed in claim 1 wherein the etch stop layer comprises Indium Aluminum Phosphide.

4. A III-V field effect transistor as claimed in claim 1 wherein the etch stop layer comprises Aluminum Gallium Phosphide.

5. A III-V field effect transistor as claimed in claim 1 further comprising a substrate supporting the semiconductor layer.

6. A III-V field effect transistor as claimed in claim 5, wherein the substrate is GaAs.

7. A III-V field effect transistor as claimed in claim 5 further comprising a buffer layer between substrate and semiconductor channel layer.

8. A III-V effect transistor as claimed in claim 7 wherein said buffer layer is AlGaAs.

9. A III-V field effect transistor as claimed in claim 7 wherein the buffer layer is a lattice matching layer for matching the substrate lattice to the lattice of the semiconductor channel layer.

10. A III-V field effect transistor as claimed in claim 1 wherein the electrically conducting channel is the top layer of the semiconductor channel layer.

11. A III-V field effect transistor as claimed in claim 10 wherein the transistor is a MESFET.

12. A III-V field effect transistor as claimed in claim 1 wherein the semiconductor layer comprises a Schottky layer separating the electrically conducting channel from the bottom of the recess.

13. A III-V field effect transistor as claimed in claim 12 further comprising an electron supply layer proximate to the electrically conducting channel.

14. A III-V field effect transistor as claimed in claim 13 wherein the electron supply layer is one of an n-AlGaAs layer or layer of silicon atoms.

15. A III-V field effect transistor as claimed in claim 13 further comprising a space layer spacing the electron supply layer from the semiconductor channel layer, the spacer layer preferably being AlGaAs.

16. A III-V field effect transistor as claimed in claim 14 wherein the semiconductor layer is GaAs.

17. A III-V field effect transistor as claimed in claim 12 wherein the transistor is a HEMT.

18. A III-V field effect transistor as claimed in claim 12 wherein the electrically conducting channel comprises a InGaAs channel layer containing a 2DEG electron gas.

19. A III-V field effect transistor as claimed in claim 18 wherein the InGaAs channel layer is sandwiched between AlGaAs spacer layers.

20. A III-V field effect transistor as claimed in claim 19 further comprising at least one electron supply layer on the opposite side of the spacer layer to the electrically conducting channel.

21. A III-V field effect transistor as claimed in claim 20 wherein the electron supply layer is a layer of silicon atoms.

22. A III-V field effect transistor as claimed in claim 18 wherein the Schottky layer is AlGaAs.

23. A III-V field effect transistor as claimed in claim 18 wherein the transistor is a pHEMT.

24. A III-V field effect transistor as claimed in claim 1 wherein the ohmic contact layer is GaAs.

25. A III-V field effect transistor is claimed in claim 12 wherein the electrically conducting channel comprises InGaAs.

26. A III-V field effect transistor as claimed in claim 25 wherein the InGaAs layer is sandwiched between InAlAs spacer layers.

27. A III-V field effect transistor as claimed in claim 26 further comprising at least one electron supply layer on the opposite side of the spacer layer to the electrically conducting channel.

28. A III-V field effect transistor as claimed in claim 27 wherein the electron supply layer is a layer of silicon atoms.

29. A III-V field effect transistor as claimed in claim 25 wherein the Schottky layer is InAlAs.

30. A III-V field effect transistor as claimed in claim 25 wherein the ohmic contact layer is InAlAs.

31. A III-V field effect transistor as claimed in claim 25 wherein the transistor is an mHEMT.

* * * * *